(12) United States Patent
Chen et al.

(10) Patent No.: US 8,378,365 B2
(45) Date of Patent: Feb. 19, 2013

(54) LIGHT EMITTING DIODE PACKAGE AND PROJECTION APPARATUS

(75) Inventors: Mei-Ling Chen, Hsinchu (TW);
Wen-Chieh Wen, Hsinchu (TW);
Haw-Woei Pan, Hsinchu (TW);
Chao-Shun Chen, Hsinchu (TW)

(73) Assignee: Young Optics Inc., Hsinchu (TW)

( * ) Notice: Subject to any disclaimer, the term of this patent is extended or adjusted under 35 U.S.C. 154(b) by 282 days.

(21) Appl. No.: 12/559,757

(22) Filed: Sep. 15, 2009

(65) Prior Publication Data

US 2010/0155756 A1 Jun. 24, 2010

(30) Foreign Application Priority Data

Dec. 22, 2008 (TW) .............................. 97150132 A (51) Int. Cl.
*H01L 33/00* (2010.01)

(52) U.S. Cl. ...... 257/98; 257/99; 257/100; 257/E33.056; 257/E33.057; 257/E33.058; 257/E33.059; 257/E33.067; 257/E33.068; 257/E33.071; 257/E33.072; 257/E33.073

(58) Field of Classification Search ............ 257/98, 257/99, 100, E33.056, E33.057, E33.058, 257/E33.059, E33.067, E33.068, E33.071, 257/E33.072, E33.073
See application file for complete search history.

(56) References Cited

U.S. PATENT DOCUMENTS

| 6,547,400 | B1 * | 4/2003 | Yokoyama | 353/98 |
|---|---|---|---|---|
| 6,905,214 | B2 | 6/2005 | Tani | |
| 7,138,667 | B2 * | 11/2006 | Barnett et al. | 257/99 |
| 7,294,861 | B2 | 11/2007 | Schardt et al. | |
| 2004/0041984 | A1 * | 3/2004 | Tani et al. | 353/20 |
| 2006/0175625 | A1 * | 8/2006 | Yokotani et al. | 257/95 |

FOREIGN PATENT DOCUMENTS

| TW | 200638302 | 11/2006 |
|---|---|---|
| TW | I278127 | 4/2007 |
| TW | 200821646 | 5/2008 |
| TW | M333573 | 6/2008 |

OTHER PUBLICATIONS

"Office Action of Taiwan counterpart application" issued on Oct. 25, 2012, p1-p12, in which the listed references were cited.

* cited by examiner

*Primary Examiner* — Jay C Kim
(74) *Attorney, Agent, or Firm* — J.C. Patents (57) ABSTRACT

A light emitting diode (LED) package including a carrier, at least one LED chip, and a light guide element is provided. The LED chip is disposed on the carrier. The light guide element including a light transmissive body, a light integration part, a reflective film, and a support part is disposed on the carrier and above the LED chip. The light integration part connected to the light transmissive body and disposed between the light transmissive body and the LED chip has a light incident surface facing the LED chip and at least one side. The side connects the light transmissive body and the light incident surface. The reflective film is disposed on the side. The support part leaning on the carrier is connected to the light transmissive body and surrounds the light integration part. The light transmissive body, the light integration part, and the support part are integrally formed.

16 Claims, 5 Drawing Sheets

LIGHT EMITTING DIODE PACKAGE AND PROJECTION APPARATUS

CROSS-REFERENCE TO RELATED APPLICATION

This application claims the priority benefit of Taiwan application serial no. 97150132, filed on Dec. 22, 2008. The entirety of the above-mentioned patent application is hereby incorporated by reference herein and made a part of this specification.

BACKGROUND OF THE INVENTION

1. Field of the Invention

The invention relates to a light source and a display device, and more particularly, the invention relates to a light emitting diode (LED) package and a projection apparatus.

2. Description of Related Art

Since luminescence efficiency of a light emitting diode (LED) has been increasing in recent years, the LED is gradually replacing traditional light source in many fields. Since the luminance of the LED is not caused by thermal emission or electric discharge but by cold luminance, the life span of the LED may be more than 100,000 hours. In addition, LEDs also have advantages of high responsive speed (about $10^{-9}$ seconds), small size, low power consumption, little pollution, high reliability, being adapted for mass production and so on. Accordingly, LEDs are wildly used in many fields.

In general, the light intensity emitted by LED chips is presented as lambertian intensity distribution. That is, a certain degree of light intensity also exists in the direction deviated from the optical axis of an LED chip. Thus, when LEDs are used as the light source of a projection apparatus, the directivity of light emitted by LEDs usually needs to be increased by light condensing components. A prior art arranges a light integration rod directly in front of LED chips to collect the light emitted by LED chips. When an LED chip adopts wire bonding techniques and is electrically connected to a circuit substrate by bonding wires, an interval has to be kept between the light incident end of the light integration rod and the light emission surface of the LED chip, so as to avoid interference of the light integration rod and bonding wires. However, on the other hand, if the light integration rod is too far away from the light emission surface of the LED chip, an excessive percentage of the light off the optic axis may not enter the light integration rod, resulting in too much light loss. Therefore, proper control of the distance between the light integration rod and the LED chip becomes a decisive factor to the improvement of light efficiency.

Nevertheless, since the size of an LED chip is smaller than other light emitting devices such as ultra high pressure (UHP) lamps, the volume of a light integration rod adapted to the LED chip has to shrink accordingly. As a result, it is difficult to align the light integration rod and LED chip, and thus the alignment error is too large and the alignment time is too long. Moreover, the large alignment error causes the yield to decrease and the long alignment time is disadvantageous to mass production.

SUMMARY OF THE INVENTION

The invention provides an LED package, and the LED package takes less time to assemble and has a higher yield.

The invention provides a projection apparatus with advantages of a simplified structure and high light efficiency.

An embodiment of the invention provides an LED package including a carrier, at least one LED chip, and a light guide element. The LED chip is disposed on the carrier. The light guide element is disposed on the carrier and above the LED chip. The light guide element includes a light transmissive body, a light integration part, a reflective film, and a support part. The light integration part is connected to the light transmissive body and disposed between the light transmissive body and the LED chip. The light integration part has a light incident surface and at least one side surface. The light incident surface faces the LED chip. The side surface connects the light transmissive body and the light incident surface. The reflective film is disposed on the side surface. The support part is connected to the light transmissive body and surrounds the light integration part. The support part leans on the carrier. The light transmissive body, the light integration part, and the support part are integrally formed.

Another embodiment of the invention provides a projection apparatus including the above-mentioned LED package, a light valve, and a projection lens. The LED chip of the LED package is capable of emitting an illumination beam, and the illumination beam is capable of passing through the light integration part and the light transmissive body sequentially. The light valve is disposed in a light path of the illumination beam from the light transmissive body, and is capable of converting the illumination beam into an image beam. The projection lens is disposed in a light path of the image beam.

Since the light transmissive body, the light integration part, and the support part of the light guide element of the LED package of the embodiment of the invention are integrally formed, and the support part may lean on the carrier, the assembly of the LED package is easier and the alignment of the light integration part and the LED chip is more accurate. Thus, the assembly time of the LED package of the embodiment of the invention is shorter and the yield is higher. In addition, since the light guide element of the LED package in the embodiment of the invention has the light integration part disposed in front of the LED chip, when the LED package is adapted to the projection apparatus, no extra light integration rod is required to be disposed outside the LED package, and the LED package simplifies the structure of the projection apparatus.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
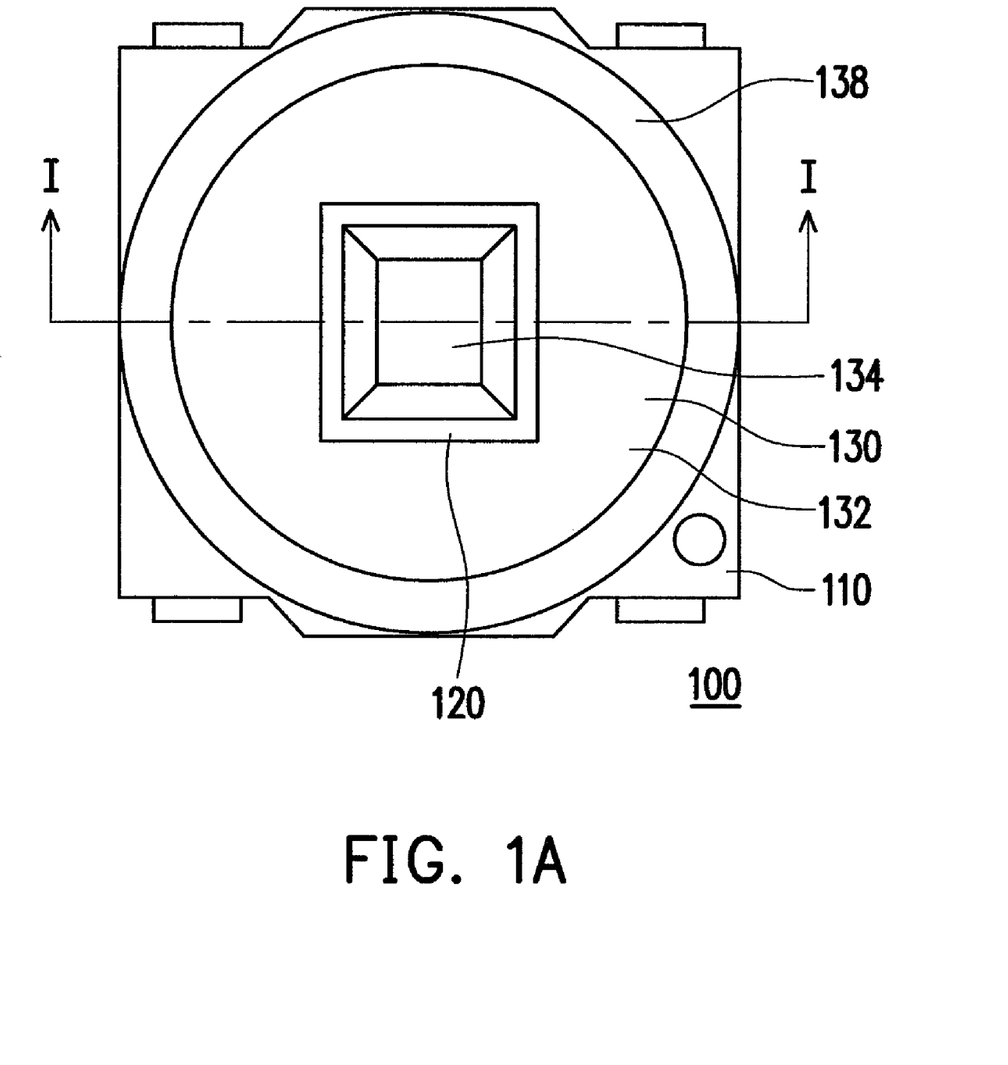
FIG. 1A is a top view showing an LED package according to an embodiment of the invention.
Figure 1B:
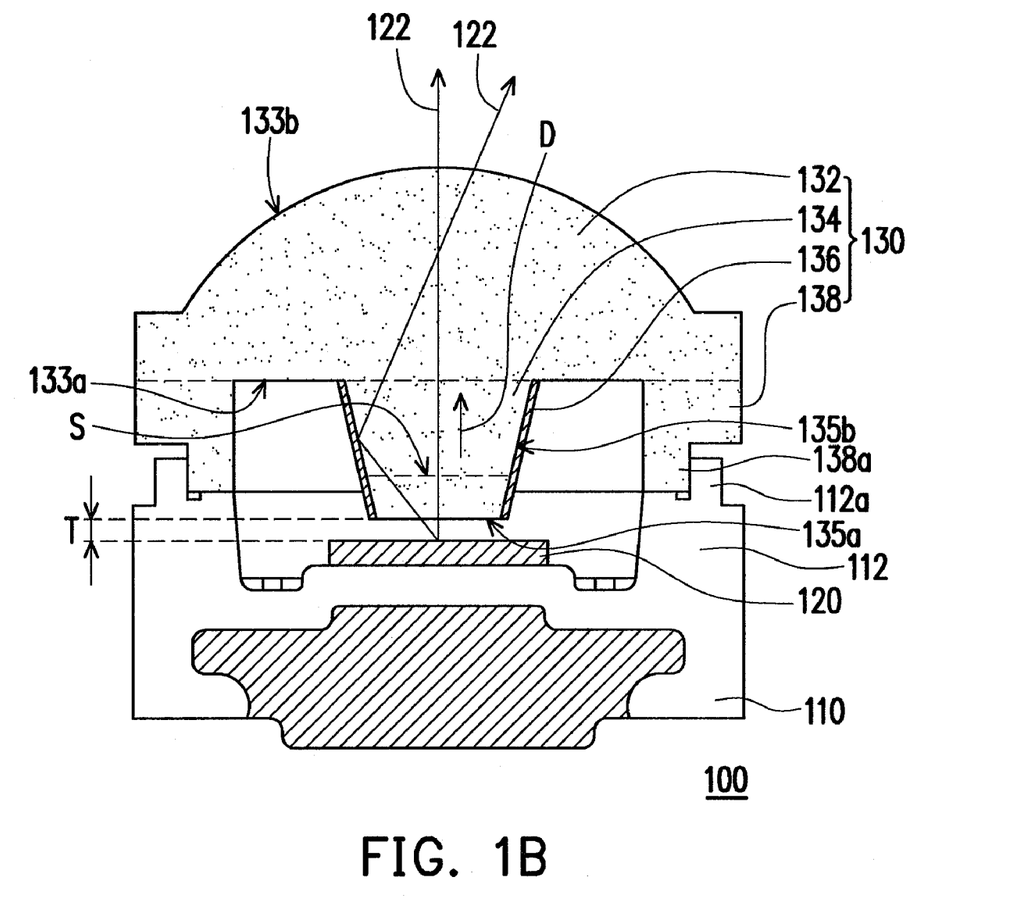
FIG. 1B is a schematic cross-sectional view showing the LED package in FIG. 1A taken along line I-I.

FIG. 1A is a top view showing an LED package according to an embodiment of the invention, and FIG. 1B is a schematic cross-sectional view showing the LED package in FIG. 1A taken along line I-I. Referring to FIGS. 1A and 1B, in the present embodiment, an LED package 100 includes a carrier 100, an LED chip 120, and a light guide element 130. In the present embodiment, the carrier 110 is, for example, a lead frame. However, in other embodiments, the carrier 110 may also be a circuit board or other appropriate carriers. The LED chip 120 is disposed on the carrier 110 and is capable of emitting an illumination beam 122. The light guide element 130 is disposed on the carrier 110 and above the LED chip 120. In the present embodiment, the light guide element 130 is disposed in a light path of the illumination beam 122. The light guide element 130 includes a light transmissive body 132, a light integration part 134, a reflective film 136, and a support part 138. In the present embodiment, the light transmissive body 132 is, for example, a convex lens to condense the illumination beam 122.

The light integration part 134 is connected to the light transmissive body 132, and is disposed between the light transmissive body 132 and the LED chip 120. The light integration part 134 has a light incident surface 135a and a plurality of side surfaces 135b. In the present embodiment, the light integration part 134 is quadrangular-rod-shaped. In addition, in the present embodiment, an area of a cross section S of the light integration part 134 parallel to the light incident surface 135a increases progressively along a direction D from the light incident surface 135a to the light transmissive body 132. However, in other embodiments, each of the cross sections S of the light integration part 134 may have an equal area. In addition, in other embodiments, the light integration part 134 may also be cylindrical-shaped and has a side surface 135b. Alternatively, in other embodiments, the light integration part 134 may also be rods in other shapes.

The light incident surface 135a faces the LED chip 120. The side surface 135b connects the light transmissive body 132 and the light incident surface 135a. The reflective film 136 is disposed on the side surface 135b to make a part of the illumination beam 122 reflected many times inside the light integration part 134, so that the illumination beam 122 may be uniformized. In addition, the illumination beam 122 is capable of passing through the light integration part 134 and the light transmissive body 132 sequentially. In the present embodiment, the light transmissive body 132 has a plane surface 133a facing the carrier 110 and a convex surface 133b facing away from the carrier 110. The illumination beam 122 is transmitted to the outside of the LED package 100 through the convex surface 133b. After the function of the light integration part 134 and the light transmissive body 132, the illumination beam 122 becomes more convergent and uniformized. In the present embodiment, an interval T is kept between the light incident surface 135a and the LED chip 120. To increase the proportion of the illumination beam 122 entering the light integration part 134, the interval T may fall within a range of 0.05 mm to 1 mm.

The support part 138 is connected to the light transmissive body 132 and surrounds the light integration part 134. The support part 138 leans on the carrier 110. The light transmissive body 132, the light integration part 134, and the support part 138 are integrally formed. In the present embodiment, the carrier 110 has a protrusion part 112 surrounding the LED chip 120, and the support part 138 leans on the protrusion part 112. In addition, in the present embodiment, the protrusion part 112 has a first micro protrusion structure 112a protruding toward the light guide element 130. In addition, in the present embodiment, the support part 138 has a second micro protrusion structure 138a protruding toward the carrier 110. The second micro protrusion structure 138a leans on the first micro protrusion structure 112a, and the second micro protrusion structure 138a is disposed between the light integration part 134 and the first micro protrusion structure 112a. However, in other embodiments, it may also be arranged that the first micro protrusion structure 112a is disposed between the second micro protrusion structure 138a and the light integration part 134. In the present embodiment, the first micro protrusion structure 112a and the second micro protrusion structure 138a are both annular-shaped.

In the present embodiment, since the light transmissive body 132, the light integration part 134, and the support part 138 of the light guide element 130 of the LED package 100 are integrally formed, when the light guide element 130 is assembled on the carrier 110, the support part 138 of the light guide element 130 may need to lean on the protrusion part 112 of the carrier 110. Consequently, accurate alignment between the light guide element 130 and the LED chip 120 is completed. Therefore, the assembly of the LED package 100 is easier, and the alignment of the light integration part 134 and the LED chip 120 is more accurate, so that the assembly time of the LED package 100 is shorter and yield of the LED package 100 is higher. Furthermore, since the alignment of the light integration part 134 and the LED chip 120 is more accurate, the light efficiency of the LED package 100 is also higher. Moreover, since the light transmissive body 132 and the light integration part 134 are integrally formed, the error in concentric degree of both optical axes may also be smaller so as to improve the uniformity of the illumination beam 122.

It should be noted that the invention does not limit the LED package 100 to have only one LED chip 120. In other embodiments, the LED package may also have a plurality of LED chips 120, wherein the colors of the LED chips 120 may be different, and the light incident surface 135a faces these LED chips 120. In addition, these LED chips 120 may also be disposed in array on the carrier 110.

Figure 2:
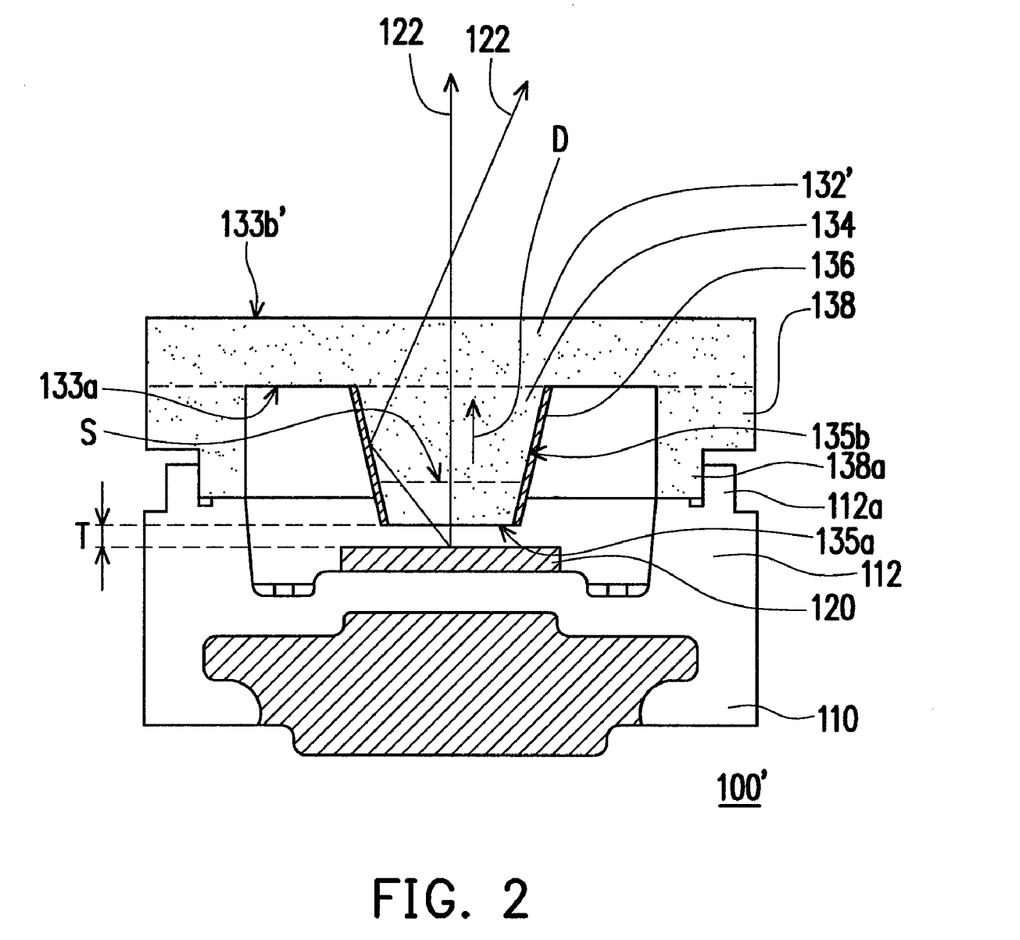
FIG. 2 is a schematic cross-sectional view showing an LED package according to another embodiment of the invention.

FIG. 2 is a schematic cross-sectional view showing an LED package according to another embodiment of the invention. Referring to FIG. 2, an LED package 100' of the present embodiment is similar to the above LED package 100 (as illustrated in FIG. 1B), and the difference between these two LED packages is described as below. In the LED package 100', a light transmissive body 132' is in the shape of a planar plate having not only a plane surface 133a facing the carrier 110 but also another plane surface 133b' facing away from the carrier 110.

Figure 3:
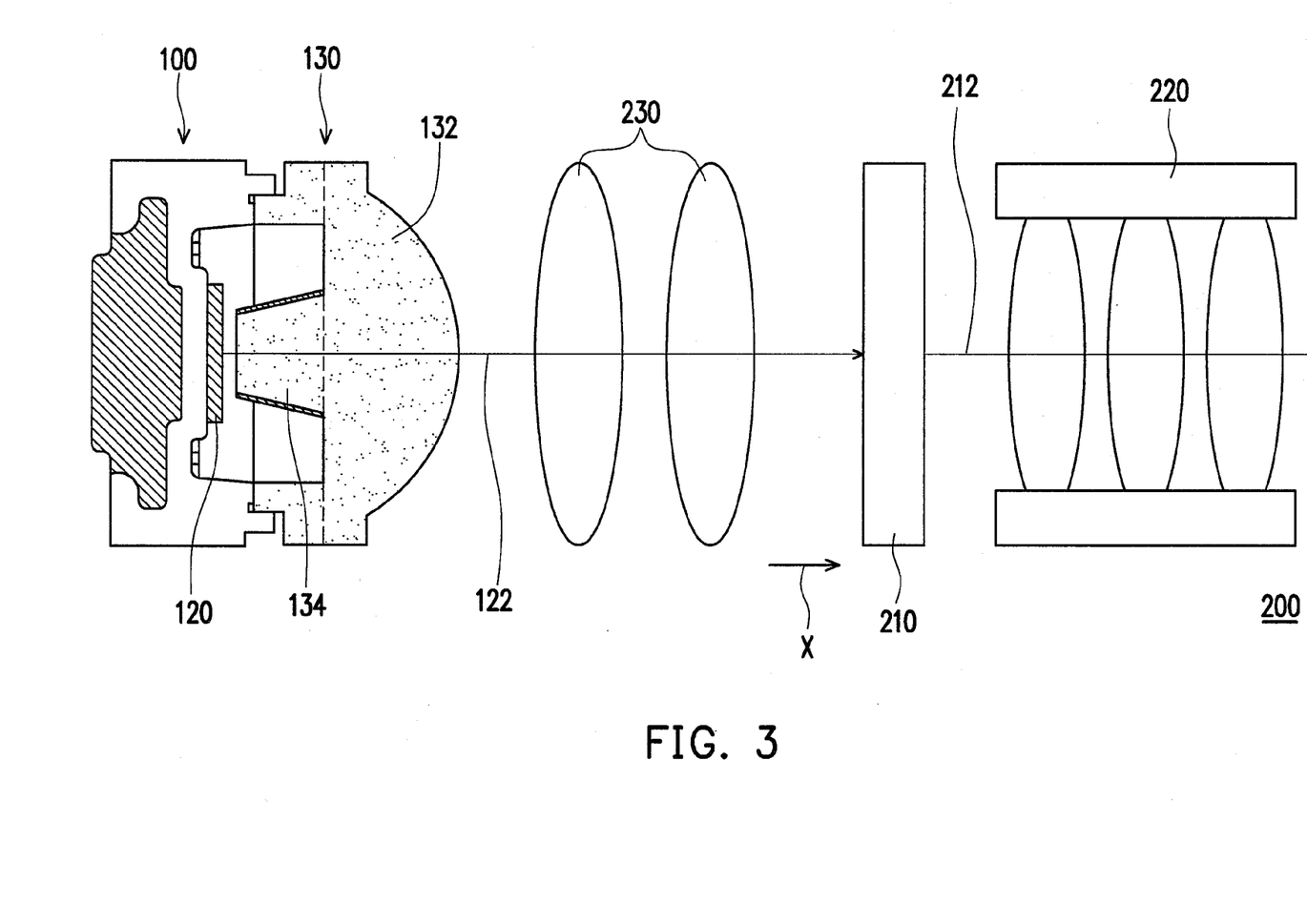
FIG. 3 is a schematic view showing a structure of a projection apparatus according to an embodiment of the invention.

FIG. 3 is a schematic view showing the structure of a projection apparatus according to an embodiment of the invention. Please refer to FIG. 3. A projection apparatus 200 of the present embodiment includes the above LED package 100 (as illustrated in FIG. 1B), a light valve 210, and a projection lens 220. The light valve 210 is disposed in a light path of the illumination beam 122 from the light transmissive body 132 and is capable of converting the illumination beam 122 into an image beam 212. In the present embodiment, the light valve 210 is, for example, a transmissive liquid crystal panel. However, in other embodiments, the light valve 210 may also be a digital micro-mirror device (DMD) or a liquid-crystal-on-silicon panel (LCOS panel). The projection lens 220 is disposed in a light path of the image beam 212 so as to project the image beam 212 onto a screen (not shown) to form image frames. In the present embodiment, at least one lens 230 is disposed between the light transmissive body 132 and the light valve 210 and in the light path of the illumination beam 122 so as to condense the illumination beam 122 to the light valve 210.

In the projection apparatus 200 of the present embodiment, since the light guide element 130 of the LED package 100 has the light integration part 134 and the reflective film 136 disposed in front of the LED chip 120, when the LED package 100 is applied to the projection apparatus 200, no extra light integration rod or other light-uniformizing devices need to be disposed outside the LED package 100. As a result, the structure of the projection apparatus 200 is simplified. Therefore, the projection apparatus 200 has a smaller volume. In addition, since the light efficiency of the LED package 100 is higher, and the uniformity of the illumination beam 122 emitted therefrom is greater, the overall light efficiency of the projection apparatus 200 is higher and image frames may be projected with better quality.

Figure 4:
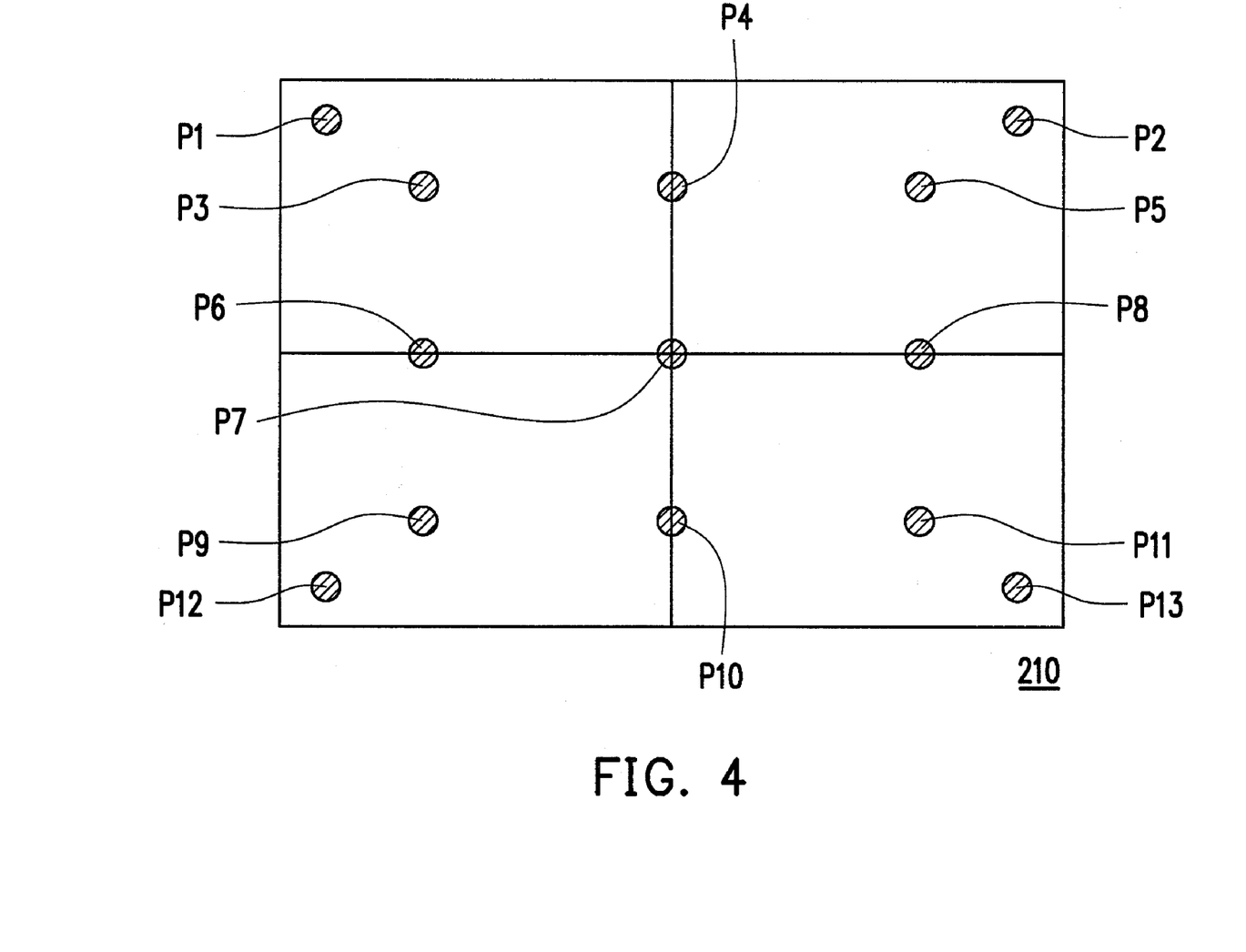
FIG. 4 is a view showing the light valve in FIG. 3 in an X direction.

FIG. 4 is a view showing the light valve in FIG. 3 in the X direction. Please refer to FIG. 3 and FIG. 4. Points P1 to P13 in FIG. 4 refer to a plurality of different positions on the light valve 210. The relative brightness of every position on the light valve 210 is shown as Table 1.

TABLE 1

| Position | Relative Brightness |
|---|---|
| Point P1 | 99.3% |
| Point P2 | 102.6% |

TABLE 1-continued

| Position | Relative Brightness |
|---|---|
| Point P3 | 110.0% |
| Point P4 | 103.3% |
| Point P5 | 101.8% |
| Point P6 | 97.0% |
| Point P7 | 100.0% |
| Point P8 | 94.8% |
| Point P9 | 103.7% |
| Point P10 | 96.3% |
| Point P11 | 119.2% |
| Point P12 | 101.8% |
| Point P13 | 102.2% |

In Table 1, the relative brightness of Point P7 is defined as 100% and other relative brightness of the remaining points is relative to the brightness of Point P7. According to Table 1, the brightness of every point is quite close. It may be thus verified that the LED package 100 may emit uniformized illumination beam 122.

In summary, since the light transmissive body, the light integration part, and the support part of the light guide element of the LED package in the embodiments of the invention are integrally formed, when the light guide element is to be assembled on the carrier, the support part of the light guide element may need to lean on the protrusion part of the carrier to bring the light guide element and the LED chip into accurate alignment. Therefore, the assembly of the LED package of the embodiments in the invention is easier, and the alignment of the light integration part and the LED chip is more accurate, so that the assembly time of the LED package is shorter and the yield of the LED package is higher. In addition, since the alignment of the light integration part and the LED chip is more accurate, the light efficiency of the LED package is also higher. Moreover, since the light transmissive body and the light integration part are integrally formed, the concentric degree error between both optical axes is also smaller so as to improve the uniformity of the illumination beam emitted by the LED package.

In the projection apparatus of the embodiments of the invention, since the light guide element of the LED package has the light integration part and the reflective film disposed in front of the LED chip, when the LED package is applied to the projection apparatus, no extra light integration rod or other components for light uniformity need to be disposed outside the LED package. As a result, the structure of the projection apparatus is simplified. Therefore, the projection apparatus has a smaller volume. In addition, since the light efficiency of the LED package is higher and the uniformity of the illumination beam emitted by the LED package is greater, the overall light efficiency of the projection apparatus is higher and image frames are projected with better quality.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode package, comprising:
a carrier, having a protrusion part formed thereon, the carrier formed of a material essentially consisting of a single material composition;
at least one light emitting diode chip, directly disposed on the carrier and the protrusion part laterally surrounding the at least one light emitting diode chip; and
a light guide element, disposed on the carrier and above the at least one light emitting diode chip, the protrusion part protruding toward the light guide element, the light guide element comprising:
a light transmissive body;
a light integration part, connected to the light transmissive body and disposed between the light transmissive body and the at least one light emitting diode chip, the light integration part comprising:
a light incident surface facing the at least one light emitting diode chip; and
at least one side surface connecting the light transmissive body and the light incident surface;
a reflective film, disposed on the at least one side surface; and
a support part, connected to the light transmissive body and surrounding the light integration part, wherein the support part leans on the protrusion part of the carrier for accurately aligning the light guide element with the at least one light emitting diode chip, and the light transmissive body, the light integration part, and the support part are integrally formed.

2. The light emitting diode package according to claim 1, wherein the light integration part is quadrangular-rod-shaped.

3. The light emitting diode package according to claim 1, wherein an area of a cross section of the light integration part parallel to the light incident surface increases progressively along a direction from the light incident surface to the light transmissive body.

4. The light emitting diode package according to claim 1, wherein the light transmissive body is in the shape of a planar plate.

5. The light emitting diode package according to claim 1, wherein the light transmissive body is a convex lens.

6. The light emitting diode package according to claim 5, wherein the convex lens has a plane surface facing the carrier and a convex surface facing away from the carrier.

7. The light emitting diode package according to claim 1, wherein the protrusion part has a first micro protrusion structure protruding toward the light guide element, the support part has a second micro protrusion structure protruding toward the carrier, the second micro protrusion structure leans on the first micro protrusion structure, and the second micro protrusion structure is disposed between the light integration part and the first micro protrusion structure or the first micro protrusion structure is disposed between the light integration part and the second micro protrusion structure.

8. The light emitting diode package according to claim 1, wherein an interval is kept between the light incident surface and the at least one light emitting diode chip, and the interval falls within a range of 0.05 millimeters to 1 millimeter.

9. A projection apparatus, comprising:
a light emitting diode package, comprising:
a carrier, having a protrusion part formed thereon, the carrier formed of a material essentially consisting of a single material composition;
at least one light emitting diode chip, directly disposed on the carrier and capable of emitting an illumination beam, the protrusion part laterally surrounding the at least one light emitting diode chip; and
a light guide element, disposed on the carrier and above the at least one light emitting diode chip, the protrusion part protruding toward the light guide element, the light guide element comprising:
a light transmissive body;
a light integration part, connected to the light transmissive body and disposed between the light transmissive body and the at least one light emitting diode chip, wherein the illumination beam is capable of passing through the light integration part and the light transmissive body sequentially, and the light integration part comprises:
a light incident surface facing the at least one light emitting diode chip; and
at least one side surface, connecting the light transmissive body and the light incident surface;
a reflective film, disposed on the at least one side surface; and
a support part, connected to the light transmissive body and surrounding the light integration part, wherein the support part leans on the protrusion part of the carrier for accurately aligning the light guide element with the at least one light emitting diode chip, and the light transmissive body, the light integration part, and the support part are integrally formed;
a light valve, disposed in a light path of the illumination beam from the light transmissive body and capable of converting the illumination beam into an image beam; and
a projection lens, disposed in a light path of the image beam.

10. The projection apparatus according to claim 9, wherein the light integration part is quadrangular-rod-shaped.

11. The projection apparatus according to claim 9, wherein an area of a cross section of the light integration part parallel to the light incident surface increases progressively along a direction from the light incident surface to the light transmissive body.

12. The projection apparatus according to claim 9, wherein the light transmissive body is in the shape of a planar plate.

13. The projection apparatus according to claim 9, wherein the light transmissive body is a convex lens.

14. The projection apparatus according to claim 13, wherein the convex lens has a plane surface facing the carrier and a convex surface facing away from the carrier.

15. The projection apparatus according to claim 9, wherein the protrusion part has a first micro protrusion structure protruding toward the light guide element, the support part has a second micro protrusion structure protruding toward the carrier, the second micro protrusion structure leans on the first micro protrusion structure, and the second micro protrusion structure is disposed between the light integration part and the first micro protrusion structure or the first micro protrusion structure is disposed between the light integration part and the second micro protrusion structure.

16. The projection apparatus according to claim 9, wherein an interval is kept between the light incident surface and the at least one light emitting diode chip, and the interval falls within a range of 0.05 millimeters to 1 millimeter.

* * * * *